(12) United States Patent
Lebo et al.

(10) Patent No.: US 9,198,308 B2
(45) Date of Patent: Nov. 24, 2015

(54) METRO CELL AGGREGATOR ENCLOSURE

(71) Applicant: Hubbell Incorporated, Shelton, CT (US)

(72) Inventors: Stephen Kent Lebo, Falls Church, VA (US); David Owen Corp, Clifton, VA (US)

(73) Assignee: Hubbell Incorporated, Shelton, CT (US)

( * ) Notice: Subject to any disclaimer, the term of this patent is extended or adjusted under 35 U.S.C. 154(b) by 138 days.

(21) Appl. No.: 13/827,424

(22) Filed: Mar. 14, 2013

(65) Prior Publication Data

US 2014/0268597 A1 Sep. 18, 2014

(51) Int. Cl.
*H05K 5/00* (2006.01)
*H05K 5/02* (2006.01)

(52) U.S. Cl.
CPC .................................. *H05K 5/0204* (2013.01)

(58) Field of Classification Search
USPC ............ 361/728–730, 752, 786, 800, 679.01, 361/748, 784, 796, 118, 724, 814, 807, 809, 361/810; 455/403; 174/50, 51, 92, 100; 385/135
See application file for complete search history.

(56) References Cited

U.S. PATENT DOCUMENTS

| | | | |
|---|---|---|---|
| 4,818,824 A | 4/1989 | Dixit et al. | |
| 4,827,502 A | 5/1989 | Suffi et al. | |
| 4,840,449 A * | 6/1989 | Ghandeharizadeh | 385/135 |
| 5,528,684 A * | 6/1996 | Schneider et al. | 379/413.03 |
| 6,322,375 B1 * | 11/2001 | Cole et al. | 439/76.1 |
| 6,795,552 B1 * | 9/2004 | Stanush et al. | 379/413.01 |
| 6,836,099 B1 * | 12/2004 | Amarillas et al. | 363/124 |
| 7,110,527 B2 | 9/2006 | Skradde et al. | |
| 8,244,090 B2 * | 8/2012 | Kutsuzawa | 385/135 |
| 2002/0123365 A1 | 9/2002 | Thorson et al. | |
| 2006/0153516 A1 * | 7/2006 | Napiorkowski et al. | 385/135 |
| 2007/0155325 A1 | 7/2007 | Bambic et al. | |
| 2007/0256848 A1 | 11/2007 | Allen et al. | |
| 2008/0013275 A1 | 1/2008 | Beckley et al. | |
| 2009/0206059 A1 * | 8/2009 | Kiko | 218/143 |
| 2009/0257728 A1 * | 10/2009 | Mures et al. | 385/139 |
| 2011/0019366 A1 | 1/2011 | Xu et al. | |
| 2012/0144665 A1 | 6/2012 | Goergen et al. | |
| 2012/0200978 A1 | 8/2012 | Miller et al. | |
| 2013/0051379 A1 | 2/2013 | Wang et al. | |
| 2014/0133124 A1 * | 5/2014 | Lebo et al. | 361/814 |
| 2014/0340822 A1 * | 11/2014 | Lal et al. | 361/652 |

OTHER PUBLICATIONS

International Searching Authority, International Search Report and Written Opinion, International Application No. PCT/US2014/0023769, Jul. 25, 2014, Alexandria, Virginia.

* cited by examiner

*Primary Examiner* — Hung S Bui
(74) *Attorney, Agent, or Firm* — Michael Best & Friedrich LLP

(57) ABSTRACT

A telecommunications aggregator enclosure includes a housing and a cover movably connected thereto. The cover is movable between open and closed positions. A printed circuit board is disposed in the housing. At least one first optical termination is connected to the printed circuit board to receive cables from a base station router. At least one second optical termination is connected to the printed circuit board to receive cables from at least one metro cell. A power supply module is connected to the printed circuit board to supply power thereto.

21 Claims, 10 Drawing Sheets

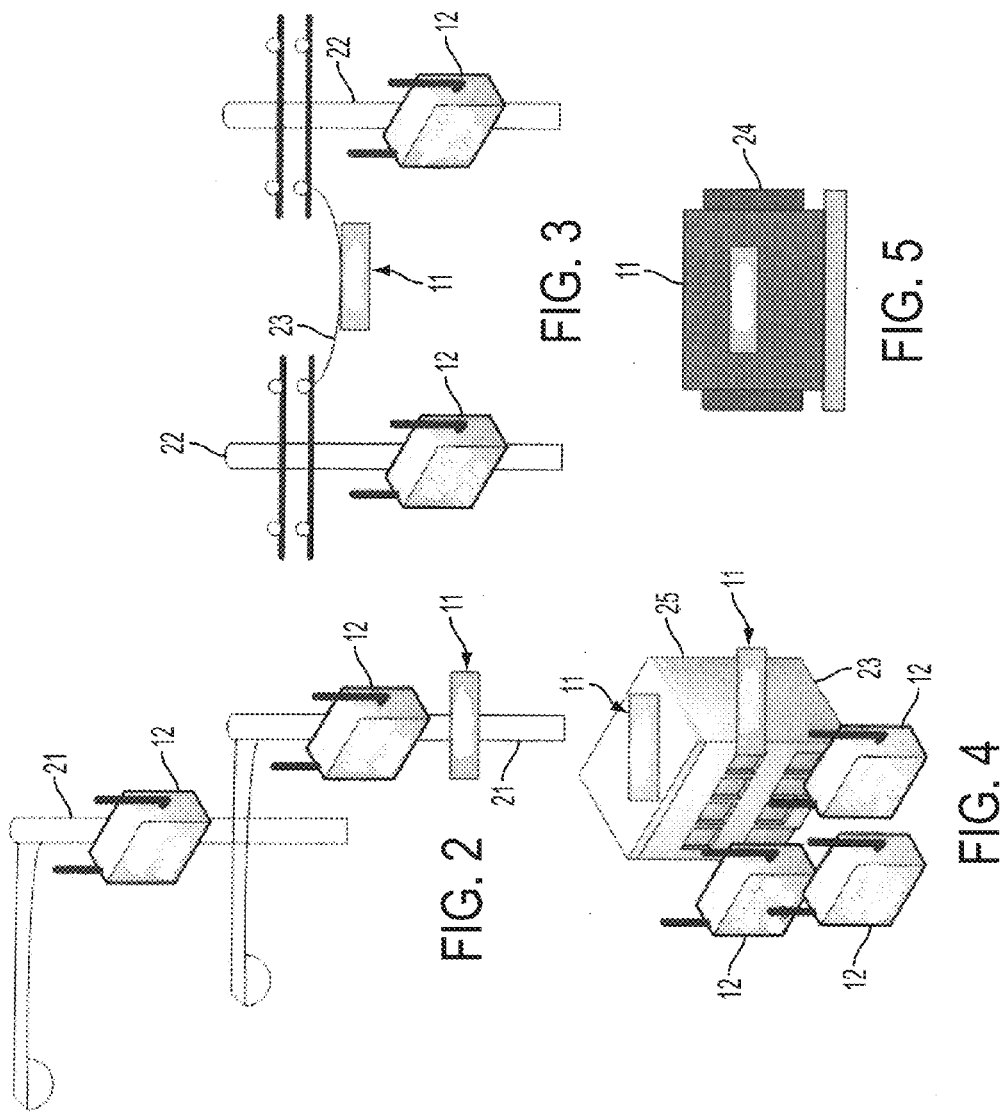

METRO CELL AGGREGATOR ENCLOSURE

FIELD OF THE INVENTION

The present invention relates generally to a metro cell aggregator enclosure disposed between a plurality of metro cells and a base station router in a telecommunications network. More particularly, the present invention relates to a metro cell aggregator enclosure to manage cables between a plurality of metro cells and a base station router in a telecommunications network. More particularly, the present invention relates to a compact enclosure for a metro cell aggregator disposed between a plurality of metro cells and a base station router in which the enclosure receives a plurality of cables and houses a power supply for powering electrical components housed therein.

BACKGROUND OF THE INVENTION

The proliferation of smart phones and other personal data devices has created an increased bandwidth demand for wireless data and service capabilities, as well as an increase in wireless traffic. The existing cell tower radios are having difficulty keeping up with the bandwidth demands required by the increased traffic. To meet such demands, existing cell tower radios are being supplemented with metro cell radios (hereinafter, metro cells).

A large number of metro cells are required to provide the desired wireless demands. Metro cells are small, such that they can easily be mounted on any widely available support, such as telephone poles or building walls. One metro cell is substantially cube-shaped or substantially rectangular-shaped. The sides of the metro cell can be as small as a few inches or slightly larger depending upon the enclosure in which the metro cell is housed. Due to the small size of the metro cells, municipalities and home owner associations generally do not object to their placement in the community. Additionally, their small size allows the metro cells to be easily deployed indoors. Accordingly, the scope of network coverage can be greatly expanded and improved through the additional of metro cells to the network.

However, each metro cell must be connected to a base station router (BSR), a radio network controller (RNC) or similar system to process and hand-off calls. As with existing large cell tower networks, the metro cells can be connected to the base station routers with fiber optic cables or microwave systems, although such connections can be copper cables or Ethernet system. When metro cells are deployed in areas in lieu of a cell tower, many metro cells are required because the metro cells provide a smaller coverage area. Additionally, many metro cells are deployed to expand the coverage area or to handle high traffic areas. Hundreds of thousands of individual metro cells may end up being handled by a single base station router. Accordingly, a need exists for a metro cell aggregator enclosure that funnels signals from the metro cells into a more manageable number of connections that can be handled by the base station router.

Another problem associated with the metro cells is the large number of fiber optic cables running between the metro cells and the base station router, which metro cells are often disposed in areas that do not have existing telephone company cabinets or enclosures. Accordingly, a need exists for a metro cell aggregator enclosure that manages the fiber optic cables between the metro cells and the base station router.

Another problem associated with the metro cells is the need to provide a demarcation point between the incumbent local exchange carrier (ILEC) and the wireless service provider. The ILEC, which could be the local telephone company, provides Ethernet-based service connections and are often over fiber cable. The wireless service provider owns the metro cell radio. In some instances, as few as a single demarcation point may be required.

Additionally, the metro cell aggregator enclosures must be comparably sized to the metro cells. The metro cell aggregator enclosures must be of a size acceptable for public mounting. Accordingly, a need exists for a compact metro cell aggregator enclosure.

SUMMARY OF THE INVENTION

An object of the present invention is to provide an improved, self-contained metro cell aggregator enclosure that manages signals between one or more metro cells and a base station router.

Another object of the present invention is to provide a metro cell aggregator enclosure that reduces the number of fiber optic cables between a plurality of metro cells and a base station router.

Still another objective of the present invention is to provide a compact metro cell aggregator enclosure that is aesthetically pleasing for public mounting.

Still another objective of the present invention is to provide a metro cell aggregator enclosure having a power supply disposed therein.

In accordance with an aspect of the present invention, a telecommunications aggregator enclosure includes a housing and a cover movably connected thereto. The cover is movable between open and closed positions. A printed circuit board is disposed in the housing. At least one first optical termination is connected to the printed circuit board to receive cables from a base station router or ILEC. At least one second optical termination is connected to the printed circuit board to receive cables from at least one metro cell. A power supply module is connected to the printed circuit board to supply power thereto.

In accordance with another aspect of the present invention, a telecommunication aggregator enclosure includes a housing and a cover movably connected to the housing between open and closed positions. A printed circuit board is disposed in the housing. At least one first optical termination is connected to the printed circuit board to receive a first set of cables from a base station router or ILEC. At least one second optical termination is connected to the printed circuit board to receive a second set of cables from at least one metro cell. A switch is connected to the printed circuit board.

Other objects, advantages and salient features of the invention will become apparent from the following detailed description, which, taken in conjunction with the annexed drawings, discloses a preferred embodiment of the present invention.

As used in this application, the terms "front," "rear," "upper," "lower," "upwardly," "downwardly," and other orientational descriptors are intended to facilitate the description of the exemplary embodiment of the present invention, and are not intended to limit the structure of the exemplary embodiment of the present invention to any particular position or orientation.

BRIEF DESCRIPTION OF THE DRAWINGS

The above aspects and features of the present invention will be more apparent from the description for an exemplary embodiment of the present invention taken with reference to the accompanying drawings, in which:

FIG. 2 is a perspective view of the metro cell aggregator enclosures of FIG. 1 secured to a light post;

FIG. 3 is a perspective view of the metro cell aggregator enclosures of FIG. 1 secured to a power pole;

FIG. 4 is a perspective view of the metro cell aggregator enclosures of FIG. 1 secured to a building;

FIG. 5 is a front elevational view of the metro cell aggregator enclosure of FIG. 1 secured to a power plant;

Throughout the drawings, like reference numerals will be understood to refer to like parts, components and structures.

DETAILED DESCRIPTION OF EXEMPLARY EMBODIMENT

Figure 1:
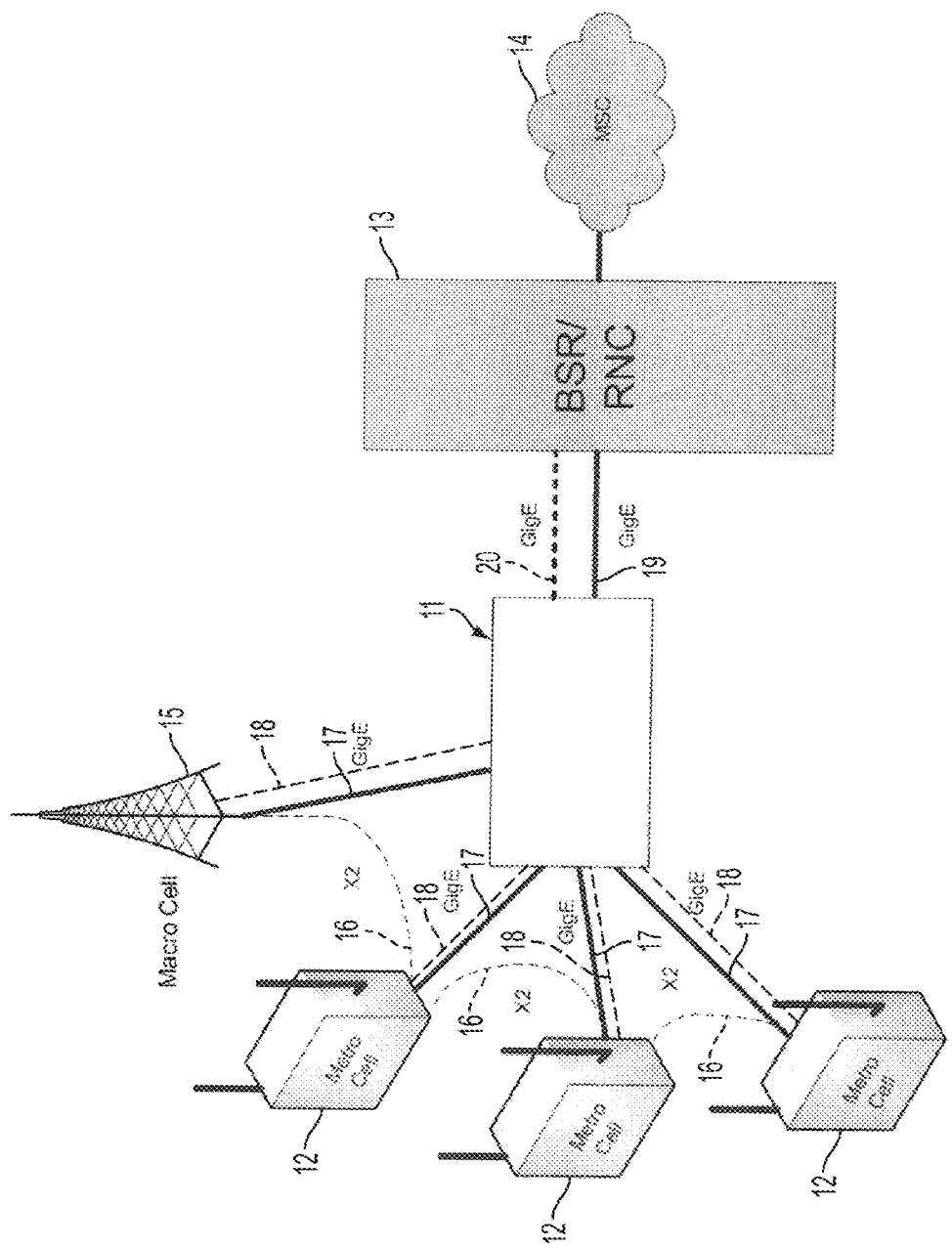
FIG. 1 is a schematic diagram of a telecommunications environment served by a metro cell aggregator enclosure in accordance with an exemplary embodiment of the present invention.
Figure 1A:
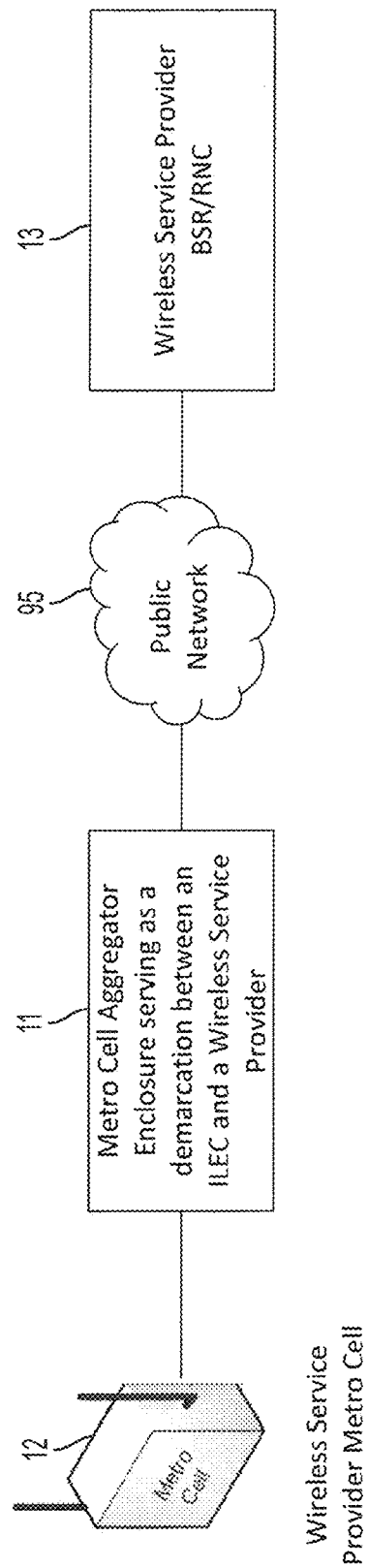
FIG. 1A is a schematic diagram in which the metro cell aggregator is a demarcation point between a wireless service provider metro cell radio and an incumbent local exchange carrier.

As shown in FIGS. 1-17, a metro cell aggregator enclosure 11 is provided that manages connections between at least one metro cell 12 and a base station router or radio network controller 13 or an incumbent local exchange carrier (ILEC). A telecommunications network, as shown in FIG. 1, includes a mobile switching center 14 that handles several base station routers 13. The mobile switching center performs the telephony switching functions of the system. FIG. 1A shows a simplified implementation in which the aggregator enclosure 11 is a demarcation point between a wireless service provider metro cell radio 12 and an ILEC 95.

The base station router 13 provides the control functions between the mobile switching center 14 and the metro cell aggregator enclosure 11. A plurality of base station routers 13 are served by a mobile switching center 14.

The metro cell aggregator enclosure 11 provides control functions between at least one metro cell 12 and the base station router 13 or ILEC 95. The metro cell aggregator enclosure can also provide control functions for existing macro cell towers 15. An X2 interface 16 is used to share information between metro cells 12 and macro cells 15 to improve handover and reduce interference therebetween.

When the metro cell aggregator is a demarcation point between at least one metro cell radio 12 owned by at least one wireless service provider, the metro cell aggregator also provides electronic diagnostic information to the ILEC so that the ILEC can determine if signals are working properly between an ILEC location and the demarc location to facilitate isolating troubles and to assure agreed upon service parameters are being met.

A GigE (gigabit Ethernet) interface connects the metro cells 12 and macro cells 15 to the metro cell aggregator enclosure 11. The GigE interface can be a wired connection 17 or a wireless connection 18. A wired or wireless GigE interface 19 and 20 also connects the metro cell aggregator enclosure 11 and the base station router 13.

As shown in FIGS. 2-5, the metro cell aggregator enclosure 11 can be mounted in a variety of locations. As shown in FIG. 2, the metro cell aggregator enclosure 11 can be mounted to a lamp post 21. Mounting metro cells 12 to lamp posts 21 can increase coverage in areas having significant foot traffic or in rural areas.

Metro cells 12 can be mounted on utility poles 22, as shown in FIG. 3. The metro cell aggregator enclosure 11 can be mounted to an aerial wire 23 extending between the utility poles 22. The metro cell aggregator enclosure 11 can also be mounted to the utility pole 22. Metro cells 12 can be mounted to utility poles 22 to expand coverage in areas having significant automobile traffic or in rural areas.

Metro cells 12 and the metro cell aggregator enclosure 11 are mounted to or in buildings 23, as shown in FIG. 4. The mountings can be on the outside 25 of the building or on the interior of the building, such as on walls or in wiring closets. Metro cells can be mounted to buildings 23, such as stadiums, shopping malls or bus stops, to expand coverage in a specific location.

The metro cell aggregator enclosure 11 can be rack mounted to an outdoor plant cabinet 24, as shown in FIG. 5, such that the metro cell aggregator 11 is located near supporting infrastructure.

A metro cell aggregator enclosure 31 in accordance with a first exemplary embodiment of the present invention is mountable to a support 32, such as, but not limited to, a lamp post, utility pole, or wall. The enclosure 31 includes a housing 33 and a cover 34 pivotally connected thereto. Preferably, the enclosure 31 has a height of approximately twelve inches, a width or approximately six inches and a depth of approximately four inches, thereby providing a compact and aesthetically pleasing enclosure. However, other suitable dimensions can be used for the enclosure 31.

Figure 7:
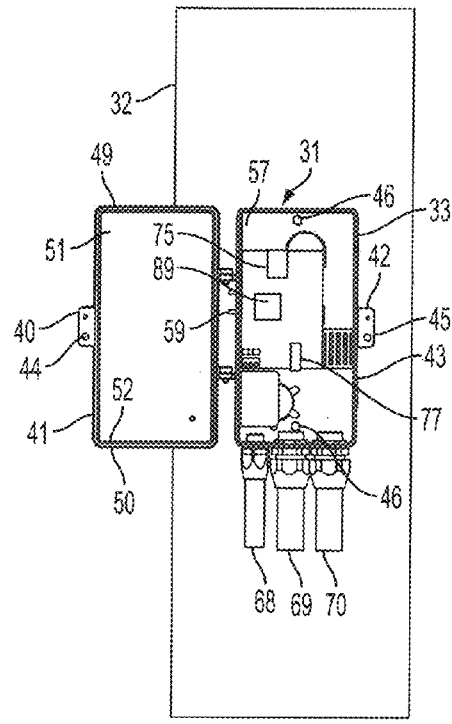
FIG. 7 is a front elevational view of the metro cell aggregator enclosure of FIG. 6.
Figure 8:
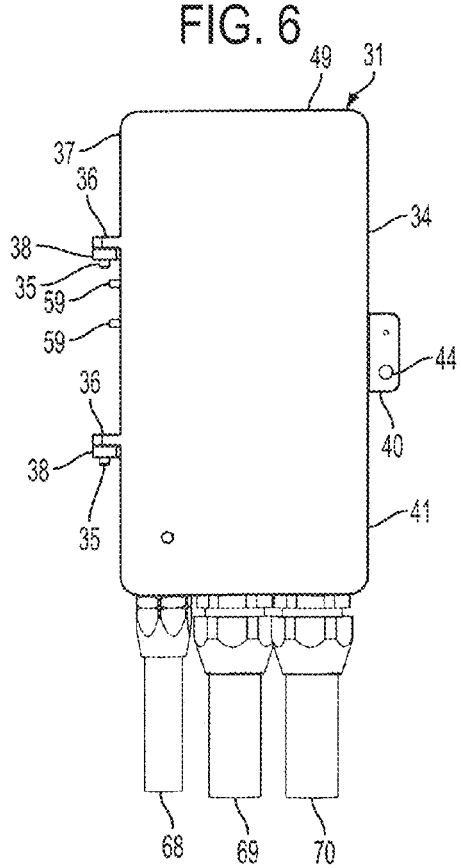
FIG. 8 is a front elevational view of the metro cell aggregator enclosure of FIG. 6 with the cover and panel in closed positions.
Figure 9:
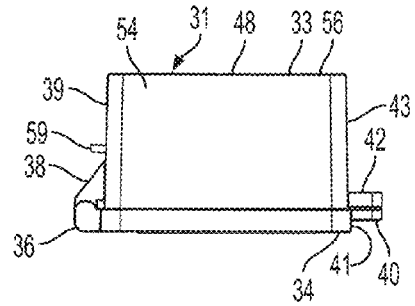
FIG. 9 is a top plan view of the metro cell aggregator enclosure of FIG. 8.
Figure 10:
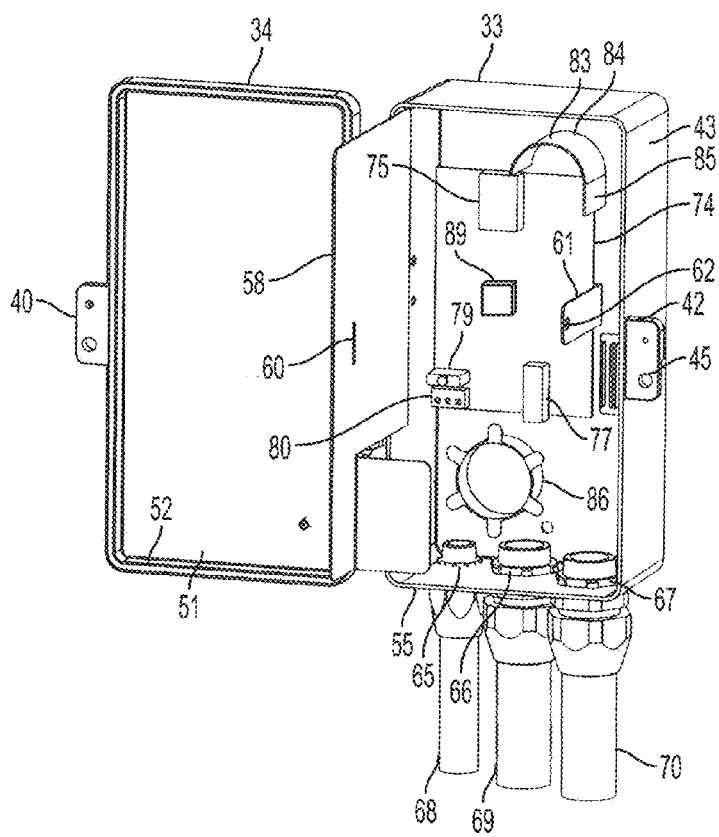
FIG. 10 is a perspective view of the metro cell aggregator enclosure of FIG. 6.

A pin 35 extends downwardly from a tab 36 of the cover 34, as shown in FIG. 8. Preferably, the cover 34 has two tabs 36 extending outwardly from a first side wall 37 thereof. The pins 35 are received by openings in corresponding tabs 38 extending outwardly from a first side wall 39 of the housing 33 to allow the cover 34 to move between an open position (FIGS. 6 and 7) and a closed position (FIGS. 8 and 9).

A locking tab 40 extends outwardly from a second side wall 41 of the cover 34. A corresponding locking tab 42 extends outwardly from a second side wall 43 of the housing 33. Openings 44 and 45 in the locking tabs 40 and 42 in the cover 34 and housing 33, respectively, are aligned when the cover 34 is in the closed position, as shown in FIG. 8, such that a screw, padlock or any other suitable fastening means can be used to secure the cover 34 to the housing 33. Multiple openings can be disposed in the locking tabs 40 and 42 to facilitate locking the cover 34 to the housing 33.

Figure 6:
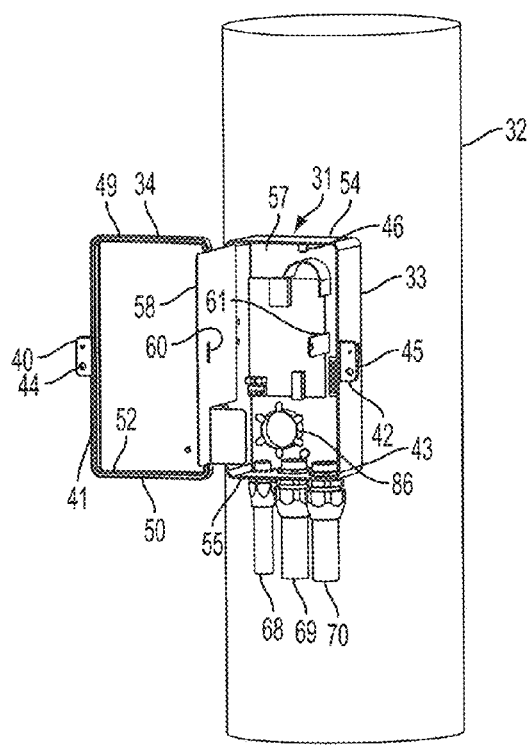
FIG. 6 is a perspective view of the metro cell aggregator enclosure in accordance with a first exemplary embodiment secured to a support with a cover and panel in open positions.

Fasteners 46 are received by fastener holes 47 (FIG. 13) in a base wall 48 of the housing 33 to secure the enclosure 31 to the support 32, as shown in FIGS. 6 and 7.

The cover 34 has first and second side walls 37 and 41 and top and bottom walls 49 and 50 extending outwardly from a main wall 51. A gasket 52 is connected to an inner surface 53 of the main wall 51 to provide a weathertight seal with the housing 33 in the closed position (FIGS. 8 and 9).

The housing 33 has first and second side walls 39 and 43 and top and bottom walls 54 and 55 extending outwardly from the base wall 48, as shown in FIGS. 6-9. The base wall 48 has an outer surface 56 disposed adjacent the support 32 and an inner surface 57.

Figure 11:
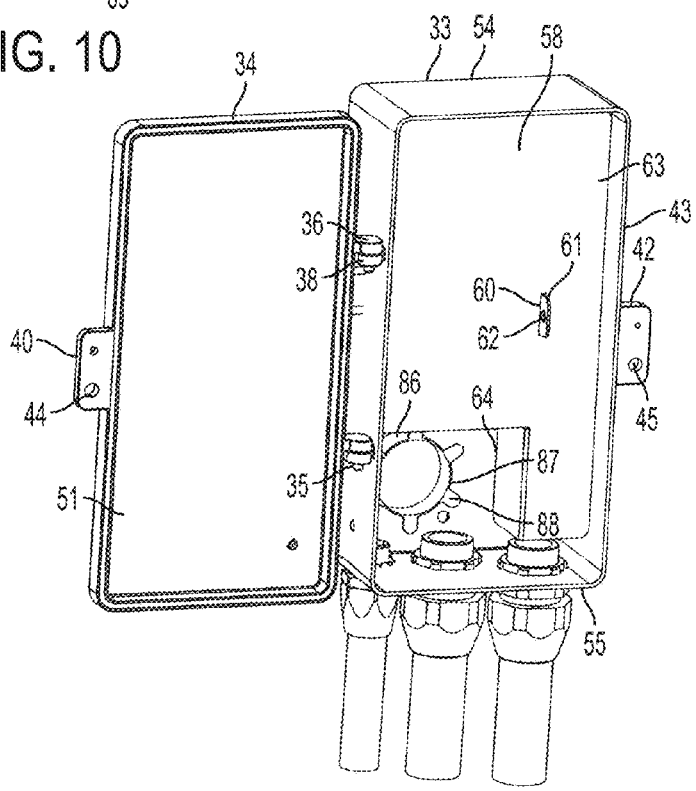
FIG. 11 is a perspective view of the metro cell aggregator enclosure of FIG. 10 with the cover in the open position and the panel in the closed position.
Figure 12:
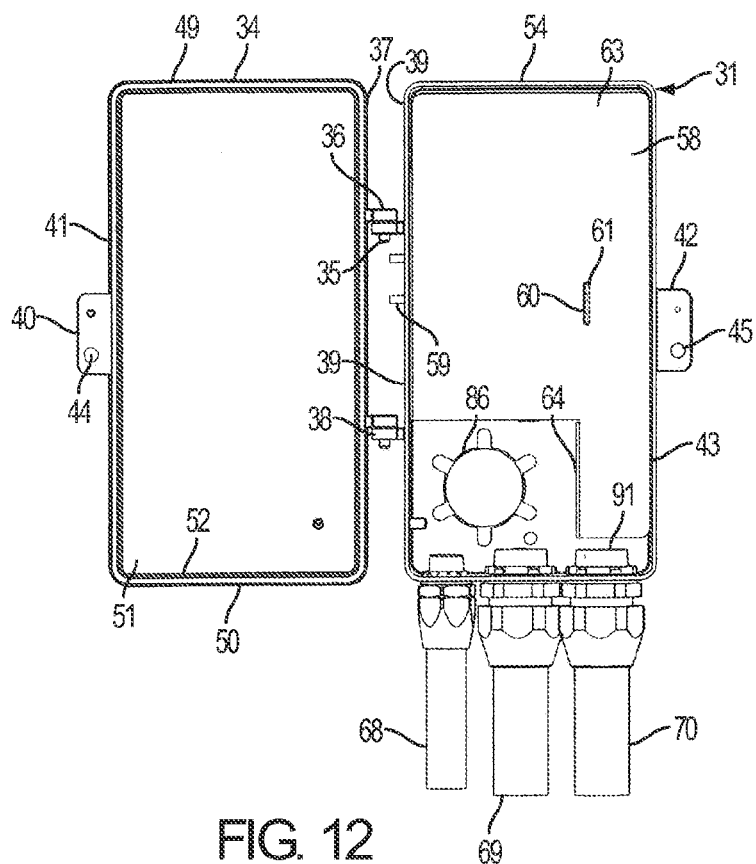
FIG. 12 is a front elevational view of the metro cell aggregator enclosure of FIG. 11.

An inner door 58 is pivotally connected to the first side wall 39 of the cover 33 of the enclosure. Hinges 59 connected to the inner door 58 allow the inner door to pivot between an open position (FIGS. 6, 7 and 10) and a closed position (FIGS. 11 and 12). A slot 60 in the inner door 58 receives a locking arm 61 extending outwardly from the inner surface 53 of the base wall 48 of the housing 33 when the inner door is in the closed position. An opening 62 in the locking arm 61 can receive a locking member, such as a screw, padlock or other suitable locking means, to secure the inner door 58 to the housing 33, thereby preventing access to the electrical components stored therein. The inner door 58 includes a first portion 63 and a second portion 64 extending substantially perpendicularly to the first portion 63. The first and second portions 63 and 64 are substantially planar. When the inner door 58 is in the closed position as shown in FIG. 11, the first portion 63 is substantially parallel to the housing base wall 48 and the second portion 64 is substantially parallel to the first and second side walls 39 and 43 of the housing 33.

Figure 14:
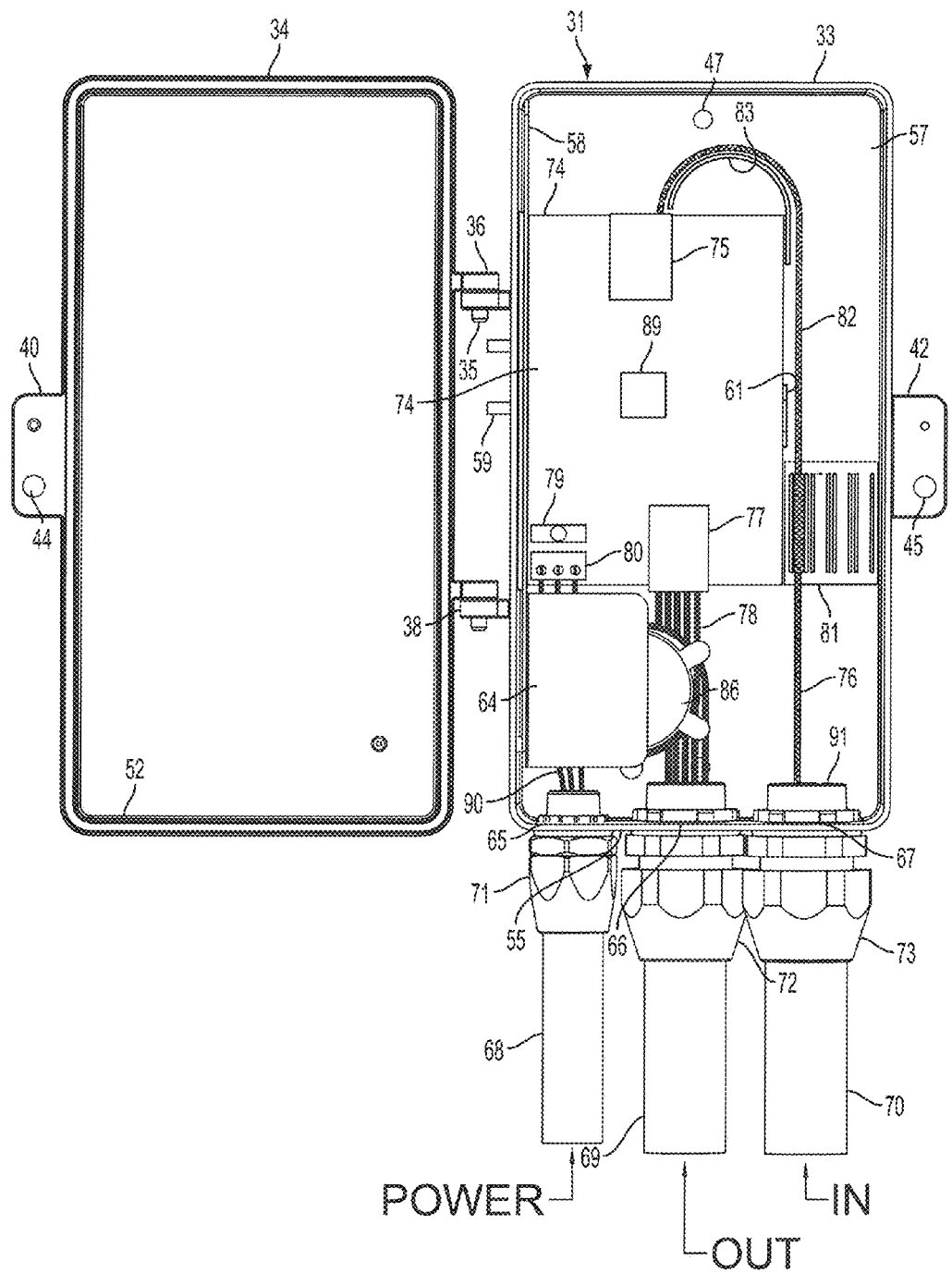
FIG. 14 is a front elevational view of the metro cell aggregator enclosure of FIG. 13 with a plurality of cables extending from the input cables to optical termination connections.

A plurality of openings 65, 66 and 67 are disposed in the bottom wall 55 of the housing 33 to allow cables of installed electrical components to pass through the housing 33, as shown in FIG. 14. The wires can be disposed in conduits 68, 69 and 70 for protection. Weathertight fittings 71, 72 and 73 are disposed at ends of the conduits 68, 69 and 70 to provide a seal at the housing 33 to protect the cables passing therethrough.

Figure 13:
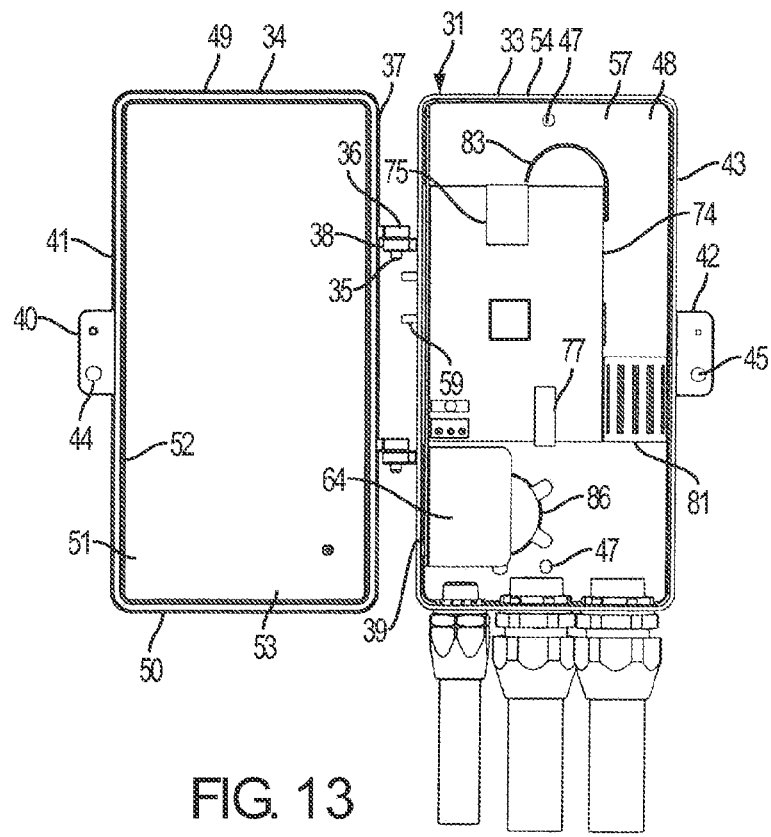
FIG. 13 is a front elevational view of the metro cell aggregator enclosure of FIG. 10.

A circuit board 74 is mounted to the inner surface 57 of the base wall 48 of the housing 33, as shown in FIGS. 13 and 14. A plurality of electrical connectors are disposed on the circuit board 74. A first set of optical terminations 75 are mounted to the circuit board 74 to terminate network fiber optic cables 76 from the base station router 13. A second set of optical termination 77 are mounted to the circuit board 74 to terminate customer fiber optic cables 78 to the metro cells 12 and macro cells 15. The optical connections, whether one single fiber or multiple fibers, can be made using small form-factor pluggable (SFP) optical transceivers. A circuit breaker 79 is connected to the circuit board 74 to provide power protection. The circuit break can take the form of a fuse, a manually resettable breaker or an automatically resettable breaker. A power supply module 80 is connected to the circuit board 74 to enable the supply of AC or DC input power. Alternatively, the circuit board 74 can have direct DC input power connections.

A splice tray 81 is mounted on the inner surface 57 of the base wall 48 of the housing 33, as shown in FIG. 14. Alternatively, a splice tray is not required when using fiber jumpers. Any suitable splice connector can be used with the splice tray 81 to splice the incoming network fiber optic cables 76 with a fiber optic pigtail cable 82 that is terminated at the first set of optical terminations 75. A cable guide 83 is disposed in the cable path between the splice tray 81 and the first set of optical termination 75 to control the bend radius of the cable 82. The cable guide 83 preferably has a substantially semi-circular portion 84 and a planar portion 85 extending from an end of the substantially semi-circular portion.

A spool 86 is mounted on the inner surface 57 of the base wall 48 of the housing 33 to manage excess fiber optic cable 78 connected to the second set of fiber optic terminations 77, as shown in FIG. 14. The spool 86 has a substantially cylindrical portion 87 around which the excess cable 78 is wrapped and a plurality of tabs 88 extending outwardly from an outer edge of the cylindrical portion 87 to prevent the excess cable from slipping off the cylindrical portion. A switch 89, such as an Ethernet switch, is connected to the printed circuit board 74, as shown in FIGS. 13 and 14. The switch 89 manages Ethernet functions, such gas, but not limited to, limiting bandwidth, assigning packet priorities, monitoring performance and diagnostics to determine whether a problem is on the ILEC side of the circuit or the wireless service provider side. The switch 89 can also split at least one of the incoming network cables 76 into at least one cable 78 out to the metro cells 12 and macro cells 15. Accordingly, the number of cables from the base station router 13 can be substantially reduced by disposing the metro cell aggregator enclosure 31 between the metro cells 12 and the base station router 13, as shown in FIG. 1.

As shown in FIGS. 1 and 14, cables 76 are connected from the base station router 13 to the metro cell aggregator enclosure 31. The cables 76 can be extended in the conduit 70 outside the enclosure 31 for protection. The conduit 70 passes through an opening 67 in the bottom wall 55 of the housing 33. A fitting 73 is connected to the housing 33 at the opening 67 to provide a weathertight seal for the passage of the cables 76. Termination cables 82 are spliced to the cables 76 at the splice tray 81. A cable guide 83 controls the bend radius of the termination cables 82 to substantially prevent undue stress therein. The termination cables 82 are terminated to the first set of optical terminals 75, which are connected to the printed circuit board 74.

The metro cell cables 78 are connected from the metro cells 12 and the macro cells 15 to the metro cell aggregator enclosure 31, as shown in FIGS. 1 and 14. The cables 78 can be run in a conduit 69 outside the enclosure 31 for protection. The conduit 69 passes through the opening 66 in the bottom wall 55 of the housing 33. A fitting 72 is connected to the housing 33 at the opening 66 to provide a weathertight seal for the passage of the cables 78. The cables 78 can be wrapped around the spool 86 to manage any excess cable in the enclosure 31. The cables 78 are terminated to the second set of optical terminals 77, which are connected to the printed circuit board 74.

Power cables 90 are connected from a power supply (not shown) to a power supply module 80 mounted on the printed circuit board 74 in the metro cell aggregator enclosure 31. The cables 90 can be run in a conduit 68 outside the enclosure 31 for protection. The conduit 68 passes through the opening 65 in the bottom wall 55 of the housing 33. A fitting 71 is connected to the housing 33 at the opening 65 to provide a weathertight seal for the passage of the power cables 90 into the enclosure 31.

Once the cables 76, 82 and 90 have been installed, the inner door 58 is moved from the open position (FIGS. 10, 13 and 14) to the closed position (FIGS. 11 and 12). The slot 60 in the inner door 58 is received by the locking arm 61 extending upwardly from the inner surface 53 of the base wall 48 of the housing 33. The inner door 58 covers the printed circuit board 74 and the splice tray 81 in the closed position. The second portion 64 of the inner door 58 extends approximately from an end 91 of the conduit 70 inside the enclosure 31 to the printed circuit board 74 and is spaced from the side wall 43 of the housing 33, thereby providing a covered channel for the cables 76 from the opening 67 in the housing 33 to the splice tray 81. A suitable locking member can be passed through the opening 62 in the locking arm 61 to lock the inner door 58 in the closed position.

The inner door 58 in the closed position partitions the enclosure 31 between accessible and inaccessible portions. The inaccessible portions, which include the cables 76 and 82, the splice tray 81 and the printed circuit board 74 and components mounted thereon, belong to the incumbent local exchange carrier. The accessible portions, which include the cables 78, belong to the wireless provider. Thus, the inner door 58 prevents the wireless provider from accessing the components belonging to the incumbent local exchange carrier.

After the cables 78 have been terminated at the second set of optical terminals 77, the cover 34 can be moved from the open position (FIGS. 6, 7 and 10-14) to the closed position (FIGS. 8 and 9). The openings 44 and 45 in the mounting tabs 40 and 42 in the cover 34 and housing 33 are aligned such that a suitable locking member can lock the cover 34 to the housing 33. The enclosure 31 is inaccessible after the cover 34 is locked to the housing 33.

The metro cell aggregator enclosure 31 provides a demarcation point between the incumbent local exchange carrier and the wireless provider. When service issues arise, the demarcation point facilitates testing the telecommunications network to determine the responsible entity, i.e., the incumbent local exchange carrier or the wireless provider, thereby facilitating resolution of the service issue without wasting resources.

Additionally, the metro cell aggregator enclosure 31 is typically accessible by electric utility, telephone and cable company personnel, as well as by wireless service providers. The metro cell aggregator enclosure 31 hands off circuits from one of these companies to another. The lockable cover 34 substantially prevents access to the enclosure 31 by the general public, the inner door 58 can partition the enclosure 31 to further limit access thereto.

Figure 15:
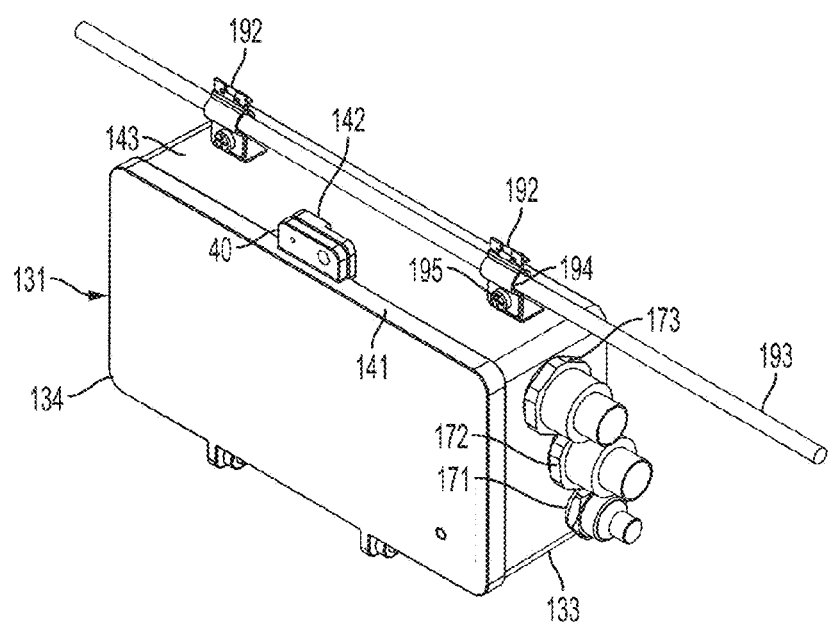
FIG. 15 is a perspective view of a metro cell aggregator enclosure in accordance with a second exemplary embodiment of the present invention.
Figure 16:
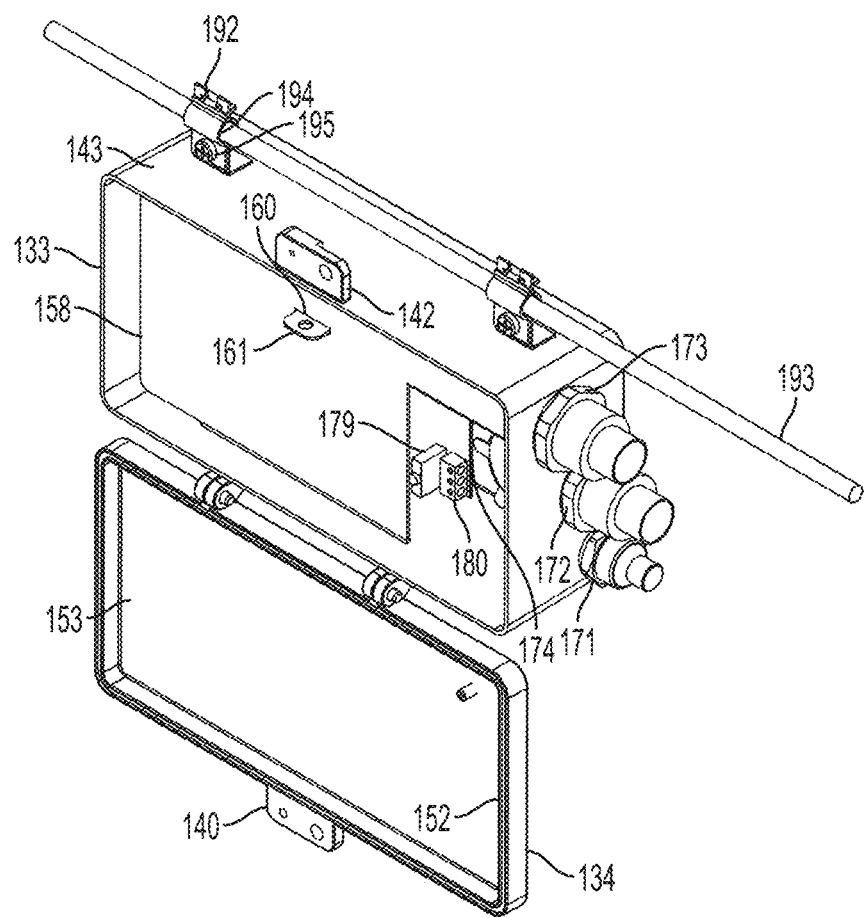
FIG. 16 is a perspective view of the metro cell aggregator enclosure of FIG. 15 with a cover in an open position and an inner door in a closed position.
Figure 17:
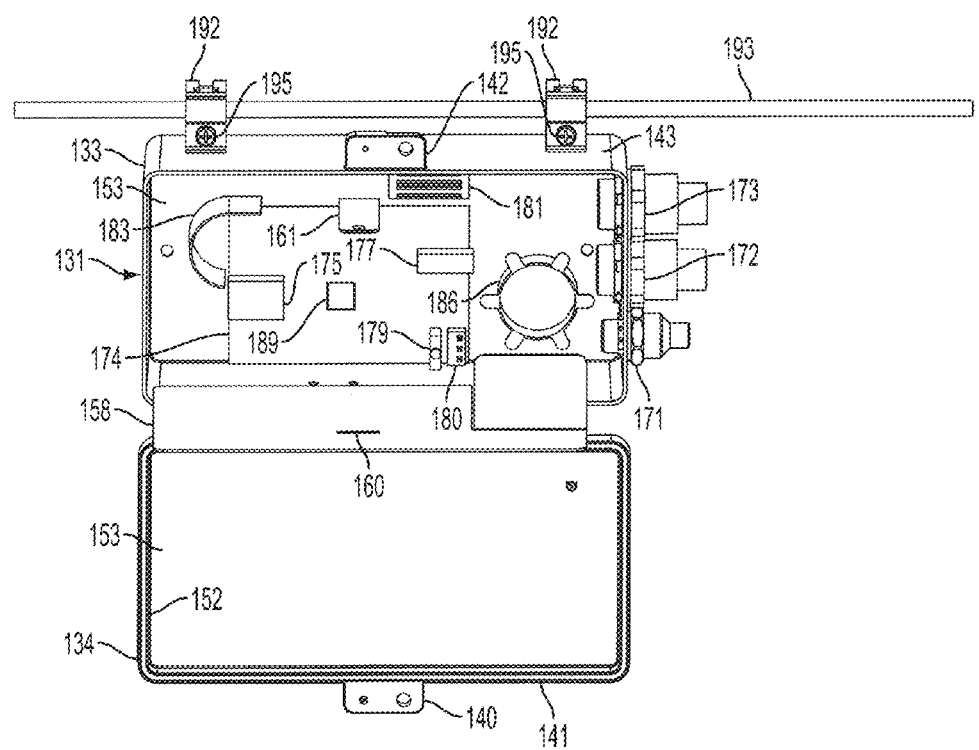
FIG. 17 is a front elevational view of the metro cell aggregator enclosure of FIG. 16 with the cover and the inner door in the open position.

A metro cell aggregator enclosure 131 in accordance with a second exemplary embodiment of the present invention is shown in FIGS. 15-17. The enclosure 131 of the second exemplary embodiment is substantially similar to the enclosure 31 of the first exemplary embodiment except that the enclosure 131 has mounting tabs 101 and 102 to allow the enclosure 131 to be suspended from an aerial wire 23 as shown in FIG. 3. Similar features of the second exemplary embodiment are identified with similar reference numbers to the corresponding features of the first exemplary embodiment in the 100 series, e.g., "1xx."

Mounting clamps 192 are connected to a second side wall 143 of a housing 133 to receive an aerial wire 193. An opening 194 in the clamp 192 receives the aerial wire 193 and a fastener 195 tightens the clamp to securely retain the aerial wire 193.

A cover 134 is rotatably connected to the housing 133 such that the cover moves between a closed position shown in FIG. 15 and an open position shown in FIGS. 16 and 17. A sealing member 152 is connected to an inner surface 153 of the cover 134 to provide a weathertight seal with the housing 133 when the cover is in the closed position.

An inner door 158 is rotatably connected to the housing 133 such that the inner door moves between a closed position shown in FIG. 16 and an open position shown in FIG. 17. A slot 160 in the inner door 158 receives a locking arm 161 extending outwardly from an inner surface 153 of the housing 33 when the inner door 158 is in the closed position, as shown in FIG. 16. The inner door 158 is substantially similar to the inner door 58 of the first exemplary embodiment such that further description thereof is omitted for brevity.

A locking tab 140 extends outwardly from a second side wall 141 of the cover 134. A corresponding locking tab 142 extends outwardly from the second side wall 143 of the housing 133. The aligned locking tabs 140 and 142, as shown in FIG. 15, can receive a suitable locking member, such as a screw, padlock or any other suitable fastening means, to secure the cover 134 to the housing 133.

Conduit fittings 171, 172 and 173 allow conduits to be secured to the housing 133. A splice tray 181 and cable guide 183 are disposed in the housing 133 to facilitate terminating cables at a first set of optical terminals 175. A cable spool 186 is disposed in the housing 133 to facilitate terminating cables at a second set of optical terminals 177. A power supply module 180, a circuit breaker 179 and the first and second sets of optical terminals 175 and 177 are connected to a printed circuit board disposed in the housing 133.

A switch 189, such as an Ethernet switch, is connected to the printed circuit board 174, as shown in FIG. 17. The switch 89 manages Ethernet functions, such as, hut not limited to, limiting bandwidth, assigning packet priorities, monitoring performance and diagnostics to determine whether a problem is on the ILEC side of the circuit or the wireless service provider side. The switch 189 can also split at least one incoming network cable (FIG. 14) into at least one cable out to at least one metro cell 12 and macro cell 15 (FIG. 1). The internal components of the enclosure 131 are substantially similar to the internal components of the first exemplary embodiment, such that further description thereof is omitted for brevity.

The foregoing embodiment and advantages are merely exemplary and are not to be construed as limiting the scope of the present invention. The description of an exemplary embodiment of the present invention is intended to be illustrative, and not to limit the scope of the present invention. Various modifications, alternatives and variations will be apparent to those of ordinary skill in the art, and are intended to fall within the scope of the invention as defined in the appended claims and their equivalents.

What is claimed is:

1. A telecommunications aggregator enclosure, comprising:
   a housing;
   a cover movably connected to said housing and movable between open and closed positions;
   an inner door movably connected to said housing and movable between open and closed positions, wherein a slot in said inner door receives a locking tab of said housing when said inner door is in said closed position to lock the inner door in said closed position;
   a printed circuit board disposed in said housing;
   at least one first optical termination connected to said printed circuit board to receive at least one first cable from a base station router or incumbent local exchange carrier;

at least one second optical termination connected to said printed circuit board to receive at least one second cable from at least one metro cell; and a power supply module connected to said printed circuit board to supply power thereto.

2. The telecommunications aggregator enclosure according to claim 1, wherein
said housing is secured to a support.

3. The telecommunications aggregator enclosure according to claim 1, wherein
said housing is suspended from an aerial wire.

4. The telecommunications aggregator enclosure according to claim 1, wherein
a circuit breaker is connected to said printed circuit board to provide power protection.

5. The telecommunications aggregator enclosure according to claim 4, wherein
said circuit breaker is selected from the group consisting of a fuse, a manually resettable circuit breaker and an automatic resetting circuit breaker.

6. The telecommunications aggregator enclosure according to claim 1, wherein
a spool is disposed in said housing to manage excess cable.

7. The telecommunications aggregator enclosure according to claim 1, wherein
a cable guide is disposed in said housing to control a bend radius of the at least one first cable.

8. The telecommunications aggregator enclosure according to claim 1, wherein
said inner door covers said printed circuit board when said inner door is in said closed position.

9. The telecommunications aggregator enclosure according to claim 1, wherein
a switch is mounted on said printed circuit board to manage Ethernet functions.

10. The telecommunications aggregator enclosure according to claim 9, wherein
said switch is an Ethernet switch or router.

11. The telecommunications aggregator enclosure according to claim 1, wherein
a gasket is connected to cover to provide a seal with said housing when said cover is in said closed position.

12. The telecommunications aggregator enclosure according to claim 1, wherein
said at least one first and second optical terminations are small form-factor pluggable (SFP) optical transceivers.

13. A telecommunications aggregator enclosure, comprising:
a housing;
a cover movably connected to said housing and movable between open and closed positions;
an inner door movably connected to said housing is movable between open and closed positions, wherein a slot in said inner door receives a locking tab of said housing when said inner door is in said closed position to lock the inner door in said closed position;
a printed circuit board disposed in said housing;
at least one first optical termination connected to said printed circuit board to receive at least one first cable from a base station router or incumbent local exchange carrier;
at least one second optical termination connected to said printed circuit board to receive at least one second cable from a plurality of metro cells; and
a switch connected to said printed circuit board to manage Ethernet functions.

14. The telecommunications aggregator enclosure according to claim 13, wherein
said housing is secured to a support.

15. The telecommunications aggregator enclosure according to claim 13, wherein
said housing is suspended from an aerial wire.

16. The telecommunications aggregator enclosure according to claim 13, wherein
said inner door partitions said housing between a first portion and a second portion.

17. The telecommunications aggregator enclosure according to claim 13, wherein
a circuit breaker is connected to said printed circuit board to provide power protection.

18. The telecommunications aggregator enclosure according to claim 17, wherein
said circuit breaker is selected from the group consisting of a fuse, a manually resettable circuit breaker and an automatic resetting circuit breaker.

19. The telecommunications aggregator enclosure according to claim 13, wherein
a first opening in said housing receives the at least one first cable and a second opening in said housing receives the at least one second cable.

20. The telecommunications aggregator enclosure according to claim 13, wherein
said at least one first and second optical terminations are small form-factor pluggable (SFP) optical transceivers.

21. The telecommunications aggregator enclosure according to claim 13, wherein
said switch is an Ethernet switch or router.

* * * * *